(12) United States Patent
Mao

(10) Patent No.: US 7,432,746 B2
(45) Date of Patent: Oct. 7, 2008

(54) CMOS BUFFER WITH COMPLEMENTARY OUTPUTS HAVING REDUCED VOLTAGE SWING

(75) Inventor: Weiwei Mao, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 11/495,882

(22) Filed: Jul. 31, 2006

(65) Prior Publication Data

US 2008/0024177 A1 Jan. 31, 2008

(51) Int. Cl.
*H03B 1/00* (2006.01)
(52) U.S. Cl. ............................ 327/108; 327/112; 326/83
(58) Field of Classification Search ........................ None
See application file for complete search history.

(56) References Cited

U.S. PATENT DOCUMENTS 6,249,145 B1 * 6/2001 Tanaka et al. ................. 326/68
6,806,734 B2 * 10/2004 Cairns et al. ................... 326/68
6,897,696 B2 * 5/2005 Chang .......................... 327/175

* cited by examiner

*Primary Examiner*—N. Drew Richards
*Assistant Examiner*—An T. Luu

(57) ABSTRACT

A buffer for interfacing complementary input signals having first logical voltage levels to a circuit operating with second logical voltage levels includes first and second branches outputting first and second complementary output signals, respectively. Each branch includes a PMOS and an NMOS transistor connected in series with a voltage-swing adjusting transistor between a first supply voltage and a second supply voltage. Control terminals of the PMOS and NMOS transistors each receive one of the complementary input signals, and a control terminal of the first voltage-swing adjusting transistor receives a first bias voltage. When the complementary input signal has a first voltage level, the voltage-swing adjusting transistor operates in a linear region and when the first complementary input signal has a second voltage level, current through the voltage-swing adjusting transistor is shut-off. No current flows in either branch when the buffer is in a static state.

13 Claims, 2 Drawing Sheets

100

200

400

CMOS BUFFER WITH COMPLEMENTARY OUTPUTS HAVING REDUCED VOLTAGE SWING

BACKGROUND AND SUMMARY

Several different logic families have been developed for circuit design, each having various advantages and disadvantages relative to each other. Two of the more popular logic families are complementary metal oxide semiconductor (CMOS) and current mode logic (CML) (also known as emitter coupled logic—ECL). These logic families operate with different voltage levels. In many applications, it is necessary or desirable to provide an interface between an output signal of a first circuit, operating with CMOS devices and voltage levels, and an input of a second circuit, operating with CML circuits and voltage levels. In that case, a buffer is used between the first circuit and the second circuit which can translate the voltage levels of the output signal of the first CMOS circuit to appropriate voltage levels for the second, CML, circuit. Typically, the input stage of the second, CML, circuit will have a very high impedance such that the buffer is not required to support high current levels.

FIG. 1 shows one buffer 100 for interfacing complementary input signals having CMOS voltage levels to a circuit operating with CML voltage levels. Buffer 100 includes a first branch 110, a second branch 150, and a voltage-swing adjusting transistor 190. First branch 110 includes a first PMOS transistor 120 and a first NMOS transistor 130 connected in series. Second branch 150 includes a second PMOS transistor 170 and a second NMOS transistor 180 connected in series.

First branch 110 and second branch 150 are each connected between a first supply voltage VDD and the voltage-swing adjusting transistor 190. The voltage-swing adjusting transistor 190 in turn is connected between the first and second branches 110, 150, and a second supply voltage VSS. The first supply voltage VDD is supplied to the control terminal of voltage-swing adjusting transistor 190 to bias it in a linear operating range. Each of the first and second branches 110 and 150 receives one of a pair of complementary input signals, $V_{IN}$ and $V_{IN}(BAR)$, and outputs one of a pair of complementary output voltages $V_{OUT}(BAR)$ and $V_{OUT}$. The control terminal of first PMOS transistor 120 is connected to VSS, and the control terminal of first NMOS transistor 130 receives $V_{IN}$. The control terminal of second PMOS transistor 170 is connected to VSS, and the control terminal of second NMOS transistor 180 receives $V_{IN}(BAR)$.

Operationally, when $V_{IN}$ is a high voltage level (e.g., logical "1") and $V_{IN}(BAR)$ is a low voltage level (e.g., logical "0"), then first NMOS transistor 130 is turned on and second NMOS transistor 180 is turned off. At the same time, first PMOS transistor 120 operates in an active region, and second PMOS transistor 170 is turned on. In that case, the output voltage $V_{OUT}(BAR)$ of first branch 110 is determined by the ratio of the resistances of first PMOS transistor 120 and voltage-swing adjusting transistor 190 as follows:

$$V_{OUT}(BAR)=V_{LOW}=(VDD-VSS)*(R190/(R120+R190)) \quad (1)$$

where R120 is the resistance of first PMOS transistor 120, and R190 is the resistance of voltage-swing adjusting transistor 190. Equation (1) assumes that R130<<R190, and R130<<R120, which will in general be true when $V_{IN}$ is a high voltage level (e.g., logical "1") and $V_{IN}(BAR)$ is a low voltage level (e.g., logical "0").

Meanwhile, the output voltage $V_{OUT}$ of second branch 150 is pulled up by second PMOS transistor 170 to be about equal to VDD.

On the other hand, when $V_{IN}$ is a low voltage level (e.g., logical "0") and $V_{IN}(BAR)$ is a high voltage level (e.g., logical "1"), then the situation with respect to first and second branches 110 and 150 is reversed, such that $V_{OUT}(BAR)$ of first branch 110 is pulled up by first PMOS transistor 120 to be about equal to VDD, and:

$$V_{OUT}=V_{LOW}=(VDD-VSS)*(R190/(R170+R190)) \quad (2)$$

where R170 is the resistance of second PMOS transistor 170. Equation (2) assumes that R180<<R190, and R180<<R170, which will in general be true when $V_{IN}$ is a low voltage level (e.g., logical "0") and $V_{IN}(BAR)$ is a high voltage level (e.g., logical "1").

So by proper selection of the channel widths of first PMOS transistor 120, second PMOS transistor 170, and voltage-swing adjusting transistor 190, it is possible to adjust the lower output voltage, $V_{LOW}$, to a desired value between VSS and VDD. Therefore, the voltage swing by the complementary output signals $V_{OUT}$ and $V_{OUT}(BAR)$, to $V_{LOW}$ to VDD, can be adjusted to match the required voltage levels of a subsequent circuit operating with a different logic family, such as CML.

However, buffer 100 does one at least one serious disadvantage. In particular, voltage-swing adjusting transistor 190 is always biased "on" in the active region regardless of the states of the complementary input voltages $V_{IN}$ and $V_{IN}(BAR)$. Therefore, buffer 100 consumes more power than a "regular" CMOS buffer.

Therefore, there is also a need for a CMOS-like complementary buffer whose output voltage has a reduced swing, from $V_{LOW}$ to VDD, where $V_{LOW}$>Vss. There is also a need for such a buffer where $V_{LOW}$ is adjustable. There is further a need for a buffer for interfacing complementary input signals having CMOS voltage levels to a circuit operating with CML voltage levels which can operate with reduced current/power consumption. There is still further a need for such a buffer which can achieve fast rise/fall times, and can make the rise and fall times to be about symmetrical.

In accordance with an example embodiment, a buffer for interfacing complementary input signals having complementary metal oxide semiconductor (CMOS) voltage levels to a circuit operating with current mode logic (CML) voltage levels, comprises: a first branch receiving a first one of the complementary input signals and outputting a first complementary output signal having CML voltage levels, and a second branch receiving a second one of the complementary input signals and outputting a second complementary output signal having CML voltage levels. The first branch includes: a first PMOS transistor having a first terminal connected to a first CMOS supply voltage, a second terminal providing the first complementary output signal, and a control terminal receiving the first complementary input signal; and a first NMOS transistor and a second PMOS transistor connected in series between the second terminal of the first PMOS transistor and a second CMOS supply voltage. The first NMOS transistor has a control terminal receiving the first complementary input signal, and the second PMOS transistor has a control terminal receiving a first branch bias voltage. The second branch includes: a third PMOS transistor having a first terminal connected to the first CMOS supply voltage, a second terminal providing the second complementary output signal, and a control terminal receiving the second complementary input signal; and a second NMOS transistor and a fourth PMOS transistor connected in series between the second terminal of the third PMOS transistor and the second CMOS supply voltage. The second NMOS transistor has a control terminal receiving the second complementary input signal, and the fourth PMOS transistor has a control terminal receiving a second branch bias voltage.

In accordance with another example embodiment, a buffer for interfacing complementary input signals having first logical voltage levels to a circuit operating with second logical voltage levels includes a first branch outputting a first complementary output signal and a second branch outputting a first complementary output signal. The first branch comprises a first PMOS transistor and a first NMOS transistor connected in series with a first voltage-swing adjusting transistor between a first supply voltage and a second supply voltage. Control terminals of the first PMOS sand NMOS transistors of the first branch each receive a first one of the complementary input signals, and a control terminal of the first voltage-swing adjusting transistor receives a first bias voltage. When the first complementary input signal has a first voltage level, the voltage-swing adjusting transistor operates in a linear region. When the first complementary input signal has a second voltage level, then current through the first voltage-swing adjusting transistor is shut-off by one of the first PMOS and NMOS transistors of the first branch. The second branch comprises a second PMOS transistor and a second NMOS transistor connected in series with a second voltage-swing adjusting transistor between the first supply voltage and the second supply voltage. Control terminals of the second PMOPS and NMOS transistors of the second branch each receive a second one of the complementary input signals, and a control terminal of the second voltage-swing adjusting transistor receives a second bias voltage. When the second complementary input signal has the first voltage level, the second voltage-swing adjusting transistor operates in the linear region. When the second complementary input signal has the second voltage level, then current through the second voltage-swing adjusting transistor device is shut-off by one of the transistors of the second branch.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 1:
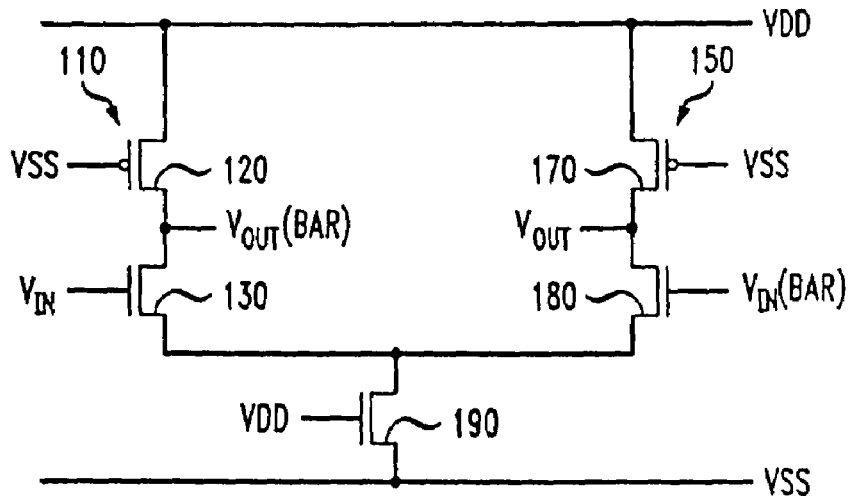
FIG. 1 shows a buffer for interfacing complementary input signals having CMOS voltage levels to a circuit operating with CML voltage levels.
Figure 2:
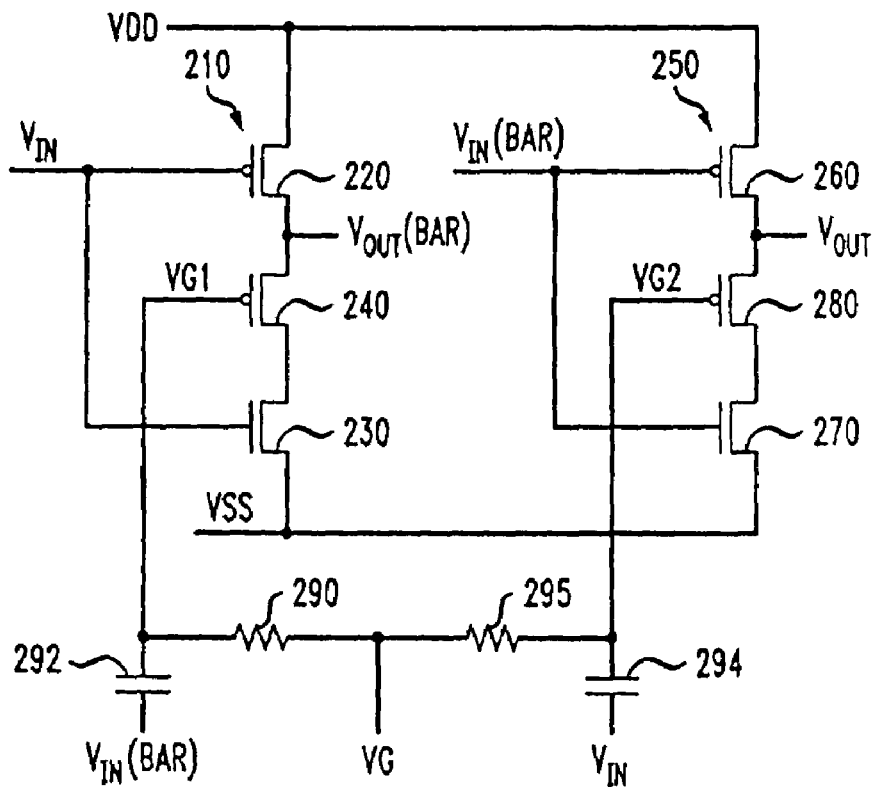
FIG. 2 shows one embodiment of a CMOS-like complementary buffer whose output signals have a reduced voltage swing, from $V_{LOW}$ to VDD, where $V_{LOW}$>VSS.

FIG. 2 shows one embodiment of a CMOS-like complementary buffer 200 whose output signals have a reduced voltage swing, from $V_{LOW}$ to VDD, where $V_{LOW}$>VSS. Buffer 200 includes a first branch 210 and a second branch 250. First branch 210 includes a first PMOS transistor 220, a first NMOS transistor 230, and a second PMOS transistor 240. Second branch 250 includes a third PMOS transistor 260, a second NMOS transistor 270, and a fourth PMOS transistor 280.

First branch 210 receives a first one of the complementary input signals, $V_{IN}$, and outputs a first complementary output signal, $V_{OUT}$(BAR), having CML voltage levels. First PMOS transistor 220 has a first terminal connected to a first CMOS supply voltage, VDD, a second terminal providing the first complementary output signal, $V_{OUT}$(BAR),and a control terminal receiving the first complementary input signal $V_{IN}$. First NMOS transistor 230 and second PMOS transistor 240 are connected in series between the second terminal of first PMOS transistor 220 and a second CMOS supply voltage, VSS. First NMOS transistor 230 has a control terminal receiving the first complementary input signal, $V_{IN}$, and second PMOS transistor 240 has a control terminal receiving a first branch bias voltage, VG1, which will be explained in further detail below. Also, first NMOS transistor 230 has a first terminal connected to the second CMOS supply voltage, VSS, while second PMOS transistor 240 has a first terminal connected to the second terminal of first PMOS transistor 220, and a second terminal connected to the second terminal of first NMOS transistor 240.

Meanwhile, second branch 250 receives a second one of the complementary input signals, $V_{IN}$(BAR), and outputs a second complementary output signal, $V_{OUT}$, having CML voltage levels. Third PMOS transistor 260 has a first terminal connected to the first CMOS supply voltage, VDD, a second terminal providing the second complementary output signal, $V_{OUT}$, and a control terminal receiving the second complementary input signal $V_{IN}$(BAR). Second NMOS transistor 270 and fourth PMOS transistor 280 are connected in series between the second terminal of third PMOS transistor 260 and the second CMOS supply voltage, VSS. Second NMOS transistor 270 has a control terminal receiving the second complementary input signal, $V_{IN}$(BAR), and fourth PMOS transistor 280 has a control terminal receiving a second branch bias voltage, VG2, which will be explained in further detail below. Also, second NMOS transistor 270 has a first terminal connected to the second CMOS supply voltage, VSS, while fourth PMOS transistor 280 has a first terminal connected to the second terminal of third PMOS transistor 260, and a second terminal connected to the second terminal of second NMOS transistor 280.

In the embodiment of FIG. 2, the control terminal of second PMOS transistor 240 having the first branch bias voltage, VG1, is connected by a first resistor 290 to a voltage-swing-adjusting bias voltage, VG. Also, the control terminal of fourth PMOS transistor 280 having the second branch bias voltage, VG2, is connected by a second resistor 295 to the voltage-swing-adjusting bias voltage, VG. Also, a first capacitor 292 is connected between the control terminal of second PMOS transistor 240 and the second complementary input signal, $V_{IN}$(BAR), and a second capacitor 294 is connected between the control terminal of fourth PMOS transistor 280 and the first complementary input signal, $V_{IN}$.

Resistors 290 and 295 are selected such that with the input currents applied to the control terminals of second and fourth PMOS transistors 240 and 280, respectively, the steady-state voltage drop across each of the resistors 290 and 295 is negligible and for all practical purposes, VG1=VG=VG2. In the embodiment of FIG. 2, the resistance of resistor 290 is the same as the resistance of resistor 295.

In operation, when $V_{IN}$ is a high voltage level (e.g., logical "1") and $V_{IN}$(BAR) is a low voltage level (e.g., logical "0"), then first PMOS transistor 220 is turned off and first NMOS transistor 230 is turned on. At the same time, second PMOS transistor 240 operates in an active region by the first branch bias voltage, VG1. In that case, the output voltage $V_{OUT}$(BAR) of first branch 210 is determined by first branch bias voltage, VG1 and the threshold voltage, $V_T$, of second PMOS transistor 240 as follows:

$$V_{OUT}(\text{BAR}) = V_{LOW} = VG1 + |V_{T240}| = VG + |V_{T240}| > VSS \quad (3)$$

Accordingly, transistor 240 is a voltage-swing adjusting transistor that operates in a linear mode when first branch 210 is outputting a low voltage level.

Meanwhile, the output voltage $V_{OUT}$ of second branch 250 is pulled up by third PMOS transistor 260 to be about equal to VDD. In that case, current through fourth PMOS transistor 240 of second branch 250 is shut-off.

On the other hand, when $V_{IN}$ is a low voltage level (e.g., logical "0") and $V_{IN}$(BAR) is a high voltage level (e.g., logical "1"), then the situation with respect to first and second branches 210 and 250 is reversed, such that $V_{OUT}$(BAR) of first branch 210 is pulled up by first PMOS transistor 220 to be about equal to VDD, and:

$$V_{OUT} = V_{LOW} = VG2 + |V_{T280}| = VG + |V_{T280}| > VSS \quad (4)$$

Accordingly, transistor 280 is a voltage-swing adjusting transistor that operates in a linear mode when second branch 250 is outputting a low voltage level. In that case, current through second PMOS transistor 240 of second branch 210 is shut-off.

So, by selection of voltage-swing-adjusting bias voltage, VG, and the threshold voltages of voltage-swing adjusting transistors 240 and 280, it is possible ta adjust the lower output voltage, $V_{LOW}$, to a desired value between VSS and VDD. Therefore, the voltage swing by the complementary output signals $V_{OUT}$ and $V_{OUT}$(BAR), from $V_{LOW}$ to VDD, can be adjusted to match the required voltage levels of a subsequent circuit operating with a different logic family, such as CML.

Meanwhile, it is noted that there is no current flowing in either of the branches 210 and 250 of buffer 200 when buffer 200 is in a static state.

Figure 3:
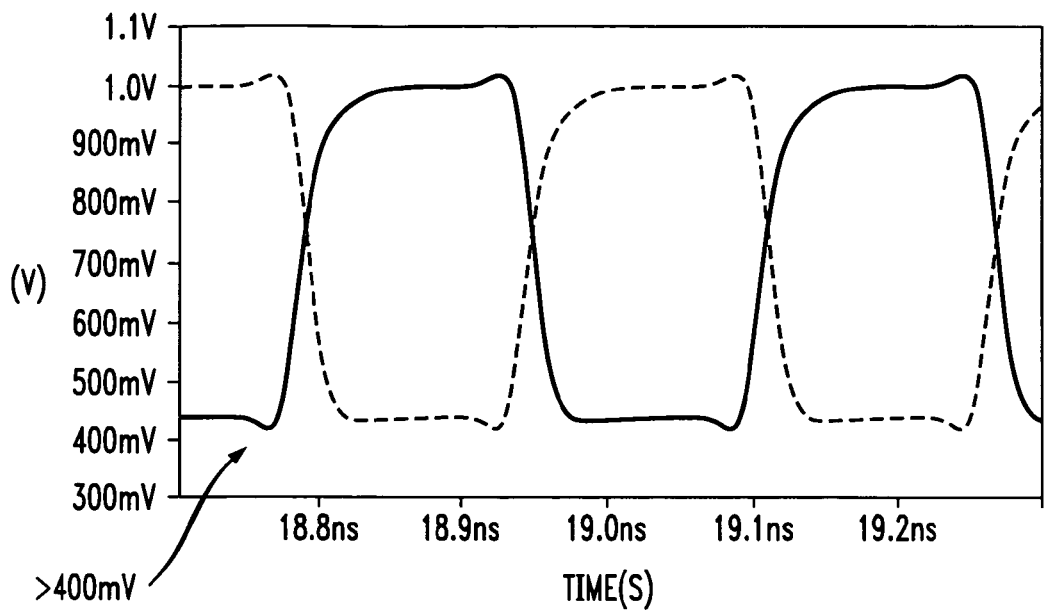
FIG. 3 shows a simulated output waveform for the buffer of FIG. 2.

FIG. 3 shows a simulated output waveform for the buffer of FIG. 2. The complementary output signals $V_{OUT}$ and $V_{OUT}$(BAR) of FIG. 3 are operating at 6.25 GB/s, and the range of the output voltage swing is from about 430 mV to about 1 Volt (VDD=1 Volt). The low end of the output voltage swing, $V_{LOW}$, can be adjusted by adjusting the voltage-swing-adjusting bias voltage, VG. Here, capacitors 292 and 294 are speed-up caps that improve the rise/fall times of the complementary output signals, $V_{OUT}$ and $V_{OUT}$(BAR). Beneficially, capacitors 292 and 294 also operate to make the waveforms of complementary output signals, $V_{OUT}$ and $V_{OUT}$(BAR) to be more symmetrical.

Variations of the buffer 200 are possible, with differing levels of performance. For example, capacitors 292 and 294 can be eliminated with some degradation in rise/fall time performance and a possible greater asymmetry for complementary output signals, $V_{OUT}$ and $V_{OUT}$(BAR). Meanwhile, in some cases first and second resistors 290 and 295 may be omitted, depending on an output impedance of a circuit supplying the voltage-swing-adjusting bias voltage, VG.

Figure 4:
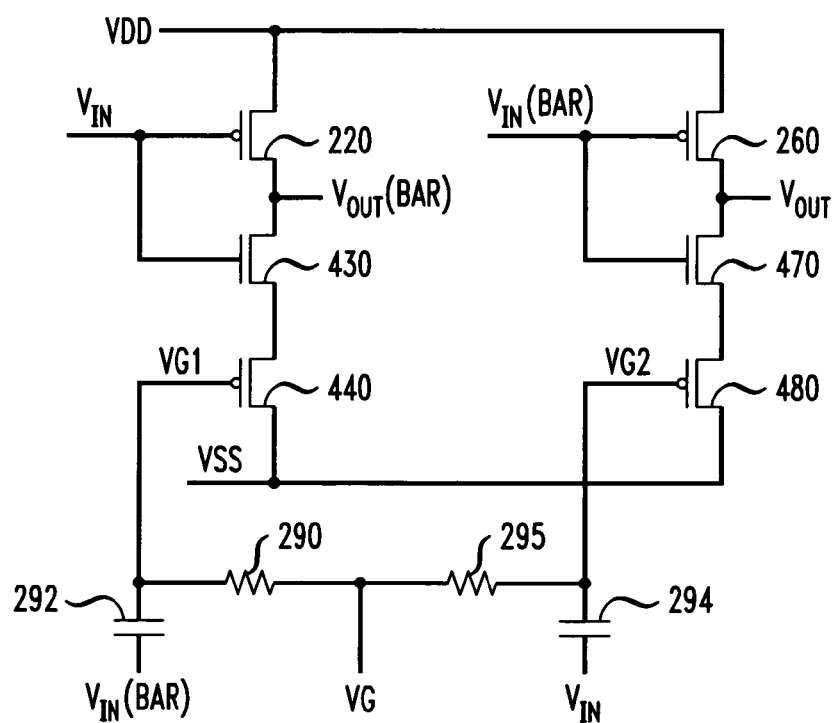
FIG. 4 shows an alternative embodiment of a CMOS-like complementary buffer whose output signals have a reduced voltage swing, from $V_{LOW}$ to VDD, where $V_{LOW}$>VSS.

FIG. 4 shows an alternative embodiment of a CMOS-like complementary buffer 400 whose output signals have a reduced voltage swing, from $V_{LOW}$ to VDD, where $V_{LOW}$>VSS.

The buffer 400 is similar in configuration to the buffer 200, with a main difference being the arrangement of the "order" of second PMOS transistor and first NMOS transistor in the first branch, and the fourth PMOS transistor and second NMOS transistor in the second branch.

More specifically, in the buffer 400 of FIG. 4, a second PMOS transistor 440 has a first terminal connected to the second CMOS supply voltage, VSS, while a first NMOS transistor 430 has a first terminal connected to the second terminal of first PMOS transistor 220, and a second terminal connected to the second terminal of second PMOS transistor 440. Also, a fourth PMOS transistor 480 has a first terminal connected to the second CMOS supply voltage, VSS, while a second NMOS transistor 470 has a first terminal connected to the second terminal of third PMOS transistor 260, and a second terminal connected to the second terminal of fourth PMOS transistor 480. Otherwise, the construction and operation of Buffer 400 are the same as those of buffer 200 described above, and so the explanation thereof will not be repeated here.

As a practical matter, buffer 200 will in general be preferred to buffer 400 because in buffer 200, the NMOS transistors 230 and 270 are connected in a direct fashion to the second CMOS voltage VSS, while in the buffer 400, the NMOS transistors 430 and 470 are not connected in a direct fashion to the second CMOS voltage VSS. So the arrangement of buffer 200 may have certain advantages from manufacturing and performance standpoints.

In accordance with illustrative embodiments described, a CMOS-like complementary buffer is disclosed having output signals with a reduced voltage swing, from $V_{LOW}$ to VDD, where $V_{LOW}$>VSS. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the scope of the appended claims.

I claim:

1. A buffer for interfacing complementary input signals having complementary metal oxide semiconductor (CMOS) voltage levels to a circuit operating with current mode logic (CML) voltage levels, the buffer comprising:

a first branch receiving a first one of the complementary input signals and outputting a first complementary output signal having CML voltage levels, the first branch including, a first PMOS transistor having a first terminal connected to a first CMOS supply voltage, a second terminal providing the first complementary output signal, and a control terminal receiving the first complementary input signal, and a first NMOS transistor and a second PMOS transistor connected in series between the second terminal of the first PMOS transistor and a second CMOS supply voltage, the first NMOS transistor having a control terminal receiving the first complementary input signal, and the second PMOS transistor having a control terminal receiving a first branch bias voltage;

a second branch receiving a second one of the complementary input signals and outputting a second complementary output signal having CML voltage levels, the second branch including, a third PMOS transistor having a first terminal connected to the first CMOS supply voltage, a second terminal providing the second complementary output signal, a control terminal receiving the second complementary input signal, and a second NMOS transistor and a fourth PMOS transistor connected in series between the second terminal of the third PMOS transistor and the second CMOS supply voltage, the second NMOS transistor having a control terminal receiving the second complementary input signal, and the fourth PMOS transistor having a control terminal receiving a second branch bias voltage.

2. The buffer of claim 1, wherein:
the first NMOS transistor has a first terminal connected to the second CMOS supply voltage, and a second terminal; and
the second PMOS transistor has a first terminal connected to the second terminal of the first NMOS transistor, and a second terminal connected to the second terminal of the first NMOS transistor.

3. The buffer of claim 2, wherein:
the second NMOS transistor has a first terminal connected to the second CMOS supply voltage, and a second terminal; and
the fourth PMOS transistor has a first terminal connected to a second terminal of the third PMOS transistor, and a second terminal connected to the second terminal of the second NMOS transistor.

4. The buffer of claim 1, wherein:
the second PMOS transistor has a first terminal connected to the second CMOS supply voltage, and a second terminal;
the first NMOS transistor has a first terminal connected to the second terminal of the first PMOS transistor, and a second terminal connected to the second terminal of the second PMOS transistor.

5. The buffer of claim 4, wherein:
the fourth PMOS transistor has a first terminal connected to the second CMOS supply voltage, and a second terminal; and
the second NMOS transistor has a first terminal connected to a second terminal of the third PMOS transistor, and a second terminal connected to the second terminal of the fourth PMOS transistor.

6. The buffer of claim 1, further comprising:
a first resistor connected between the control terminal of the second PMOS transistor and a voltage-swing-adjusting bias voltage; and
a second resistor connected between the control terminal of the fourth PMOS transistor and the voltage-swing-adjusting bias voltage.

7. The buffer of claim 6, wherein a resistance of the first resistor is the same as that of the second resistor.

8. The buffer of claim 6, wherein the first and second complementary output signals swing between an upper voltage that is about equal to t the first CMOS supply voltage, and a lower voltage that is about equal to a sum of the voltage-swing-adjusting bias voltage and a threshold voltage of one of the second and fourth PMOS transistors.

9. The buffer of claim 1, further comprising:
a first capacitor connected between the control terminal of the second PMOS transistor and the second complementary input signal; and
a second capacitor connected between the control terminal of the fourth PMOS transistor and the first complementary input signal,
wherein the first and second capacitors have a same capacitance as each other.

10. A buffer for interfacing complementary input signals having first logical voltage levels to a circuit operating with second logical voltage levels, the buffer comprising:

a first branch outputting a first complementary output signal from a first complementary output terminal, the first branch comprising a first NMOS transistor and a first voltage-swing-adjusting transistor connected in series with a first PMOS transistor between a first supply voltage and a second supply voltage, wherein the first NMOS transistor and first voltage-swing-adjusting transistor are further connected in series between the first complementary output terminal and the second supply voltage, wherein control terminals of the first PMOS and NMOS transistors of the first branch each receive a first one of the complementary input signals, and a control terminal of the first voltage-swing-adjusting transistor receives a first bias voltage, and wherein when the first complementary input signal has a first voltage level, the first voltage-swing-adjusting transistor operates in a linear region and when the first complementary input signal has a second voltage level, current through the first voltage-swing-adjusting transistor is shut-off by one of the first PMOS and NMOS transistors of the first branch; and a second branch outputting a second complementary output signal from a second complementary output terminal, the second branch comprising a second NMOS transistor and a second voltage-swing-adjusting transistor connected in series with a second PMOS transistor between a first supply voltage and a second supply voltage, wherein the second NMOS transistor and second voltage-swing-adjusting transistor are further connected in series between the second complementary output terminal and the second supply voltage, wherein control terminals of the second PMOS and second NMOS transistors of the second branch each receive a second one of the complementary input signals, and a control terminal of the second voltage-swing-adjusting transistor receives a second bias voltage, and wherein when the second complementary input signal has a first voltage level, the second voltage-swing-adjusting transistor operates in a linear region and when the second complementary input signal has a second voltage level, current through the second voltage-swing-adjusting transistor is shut-off by one of the second PMOS and second NMOS transistors of the second branch;

a first resistor connected between the control terminal of the first voltage-swing transistor and a voltage-swing-adjusting bias voltage; and a second resistor connected between the control terminal of the second voltage-swing transistor and the voltage-swing-adjusting bias voltage.

11. The buffer of claim 10, wherein a resistance of the first resistor is the same as that of the second resistor.

12. The buffer of claim 10, wherein the first and second complementary output signals swing between an upper voltage that is about equal to the first CMOS supply voltage, and a lower voltage that is about equal to a sum of the first voltage-swing-adjusting bias voltage and a threshold voltage of one of the first and second voltage-swing adjusting transistors.

13. A buffer for interfacing complementary input signals having first logical voltage levels to a circuit operating with second logical voltage levels, the buffer comprising:

a first branch outputting a first complementary output signal from a first complementary output terminal, the first branch comprising a first NMOS transistor and a first voltage-swing-adjusting transistor connected in series with a first PMOS transistor between a first supply voltage and a second supply voltage, wherein the first NMOS transistor and first voltage-swing-adjusting transistor are further connected in series between the first complementary output terminal and the second supply voltage, wherein control terminals of the first PMOS and NMOS transistors of the first branch each receive a first one of the complementary input signals, and a control terminal of the first voltage-swing-adjusting transistor receives a first bias voltage, and wherein when the first complementary input signal has a first voltage level, the first voltage-swing-adjusting transistor operates in a linear region and when the first complementary input signal has a second voltage level, current through the first voltage-swing-adjusting transistor is shut-off by one of the first PMOS and NMOS transistors of the first branch;

a second branch outputting a second complementary output signal from a second complementary output terminal, the second branch comprising a second NMOS transistor and a second voltage-swing-adjusting transistor connected in series with a second PMOS transistor between a first supply voltage and a second supply voltage, wherein the second NMOS transistor and second voltage-swing-adjusting transistor are further connected in series between the second complementary output terminal and the second supply voltage, wherein control terminals of the second PMOS and second NMOS transistors of the second branch each receive a second one of the complementary input signals, and a control terminal of the second voltage-swing-adjusting transistor receives a second bias voltage, and wherein when the second complementary input signal has a first voltage level, the second voltage-swing-adjusting transistor operates in a linear region and when the second complementary input signal has a second voltage level, current through the second voltage-swing-adjusting transistor is shut-off by one of the second PMOS and second NMOS transistors of the second branch;

a first capacitor connected between the control terminal of the first voltage-swing adjusting transistor and the second complementary input signal; and a second capacitor connected between the control terminal of the second voltage-swing adjusting transistor and the first complementary input signal, wherein the first and second capacitors have a same capacitance as each other.

\* \* \* \* \*